United States Patent
Cai et al.

(10) Patent No.: US 7,379,302 B2
(45) Date of Patent: May 27, 2008

(54) DISPLAY DEVICE WITH HEAT CONDUCTING MEMBER FOR HEAT DISSIPATION

(75) Inventors: Zhi-Yuan Cai, Shenzhen (CN); Te-Hsu Wang, Miao-Li (TW); Chih-Jen Sun, Miao-Li (TW)

(73) Assignees: Innocom Technology (Shenzhen) Co., Ltd., Shenzhen, Guangdong Province (CN); Innolux Display Corp., Miao-Li County (TW)

( * ) Notice: Subject to any disclaimer, the term of this patent is extended or adjusted under 35 U.S.C. 154(b) by 32 days.

(21) Appl. No.: 11/446,760

(22) Filed: Jun. 5, 2006

(65) Prior Publication Data
US 2006/0274225 A1    Dec. 7, 2006

(30) Foreign Application Priority Data
Jun. 3, 2005    (CN)    .............................. 94 2 09305

(51) Int. Cl.
*H05K 7/20*    (2006.01)
(52) U.S. Cl. ...................... 361/710; 361/681; 361/687; 361/714; 174/50; 174/50.1; 313/11; 313/13; 345/60; 345/84; 349/58

(58) Field of Classification Search ................ 361/681, 361/683, 687, 686, 704, 714, 767, 689, 724–727, 361/808, 809, 825, 831; 165/80.3, 80.4, 165/104.33, 185, 122, 126; 174/50, 50.1, 174/254, 260; 313/11, 13, 17, 22–25, 35, 313/44, 46, 498, 562, 583, 587; 345/60, 345/84, 87; 349/58, 61, 62–65; 362/31, 362/373
See application file for complete search history.

(56) References Cited

U.S. PATENT DOCUMENTS

| 6,362,860 | B1 | 3/2002 | Sagawa |
| 6,714,410 | B2* | 3/2004 | Wellhofer .................... 361/687 |
| 6,833,674 | B2* | 12/2004 | Kaneko et al. ............. 313/587 |
| 7,164,586 | B2* | 1/2007 | Lin ............................ 361/714 |
| 7,254,031 | B2* | 8/2007 | Kim et al. .................. 361/717 |
| 7,259,964 | B2* | 8/2007 | Yamamura et al. ......... 361/697 |
| 2004/0196628 | A1* | 10/2004 | Hisano et al. .............. 361/689 |

FOREIGN PATENT DOCUMENTS

JP    407210093 A    *    8/1995

* cited by examiner

Primary Examiner—Michael Datskovskiy
(74) Attorney, Agent, or Firm—Wei Te Chung

(57) ABSTRACT

An exemplary display device (1) includes a chassis (12), a circuit board (14) and a heat sink (16). The heat sink connects with the circuit board and the chassis. The chassis covers the circuit board and includes at least one heat conducting member (120) connecting with the heat sink. The display device performs an increased heat dissipating efficiency, and can be conveniently assembled or disassembled.

15 Claims, 5 Drawing Sheets

US 7,379,302 B2

DISPLAY DEVICE WITH HEAT CONDUCTING MEMBER FOR HEAT DISSIPATION

FIELD OF THE INVENTION

The present invention relates to display devices, and more particularly to a display device with one or more heat conducting members involved in dissipating heat generated in the display device out from the display device.

GENERAL BACKGROUND

Referring to FIG. 7, a typical display device 7 includes a chassis 72, a circuit board 74, a heat sink 76, and a rectangular heat conductor 78. The chassis 72 covers the circuit board 74, the heat sink 76, and the heat conductor 78. The circuit board 74 includes an associated power socket 742. The heat sink 76 connects with the circuit board 74. The heat conductor 78 connects with the heat sink 76 and the chassis 72.

In operation, most of heat generated by electronic components (not shown) on the circuit board 74 can be conducted to the heat conductor 78 through the heat sink 76, whereupon the heat is conducted to the chassis 72. With this configuration, the circuit board 74 and other electronic elements (not shown) of the display device 7 can operate without overheating. However, during the process of heat conduction from the circuit board 74 to the chassis 72, heat must pass through the heat conductor 78. The heat conductor 78 itself has an amount of heat resistance. Therefore the heat dissipating efficiency of the system may still be unsatisfactory. Moreover, a tool and an associated manufacturing process are needed for localizing the heat conductor 78 during mass production of the display device 7. That is, assembly of the display device 7 is unduly complicated, and the overall cost of the display device 7 is increased.

What is needed, therefore, is a display device that can overcome the above-described deficiencies.

SUMMARY

An exemplary display device includes a chassis, a circuit board and a heat sink. The heat sink connects with the circuit board and the chassis. The chassis covers the circuit board and includes at least one heat conducting member connecting with the heat sink.

Other advantages and novel features will become more apparent from the following detailed description when taken in conjunction with the accompanying drawings. In the drawings, all the views are schematic.

DETAILED DESCRIPTION OF PREFERRED EMBODIMENTS

Reference will now be made to the drawings to describe the preferred embodiments in detail.

Figure 1:
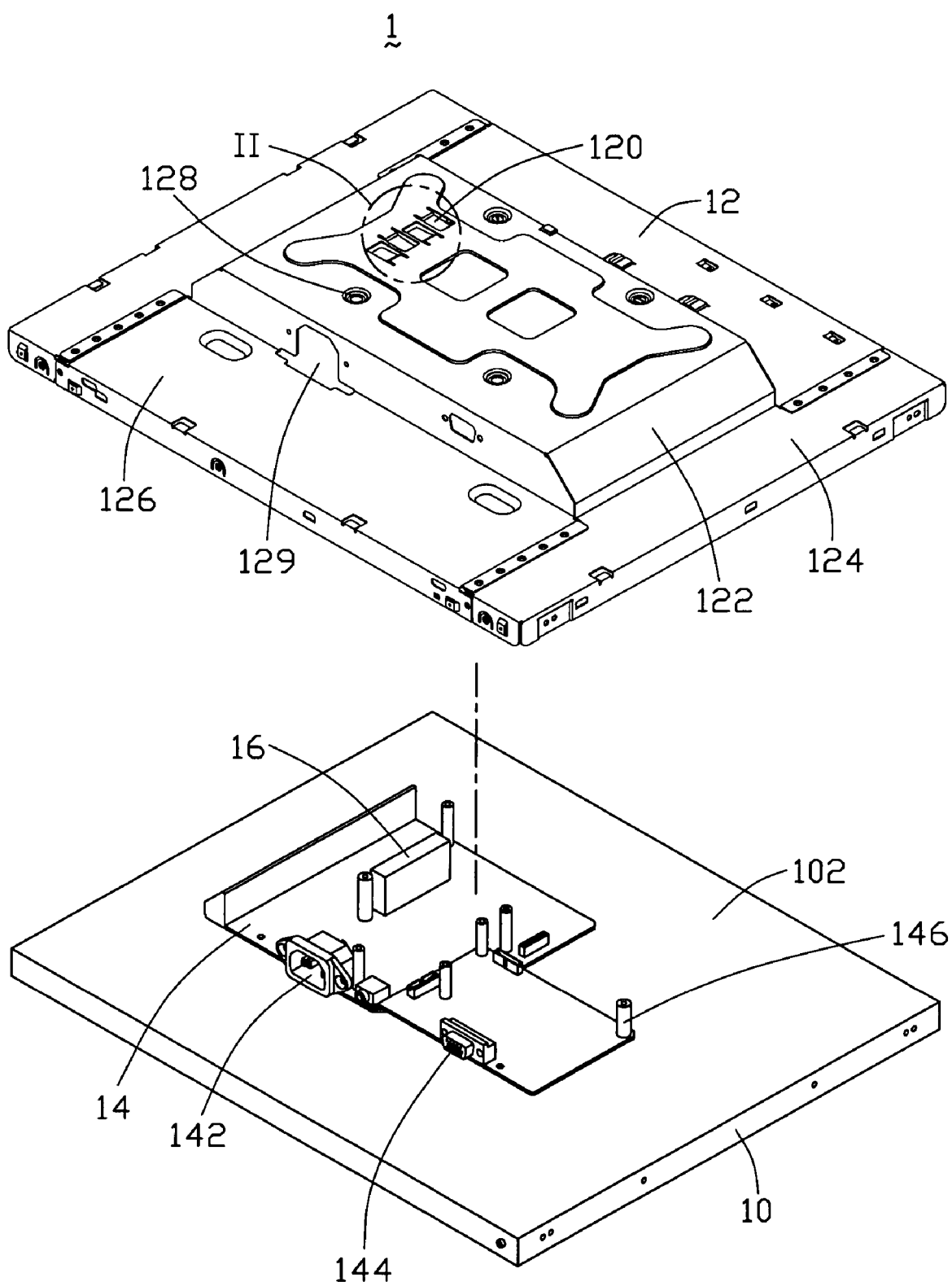
FIG. 1 is an exploded, isometric view of a display device according to a first embodiment of the present invention.

Referring to FIG. 1, a display device 1 according to a first embodiment of the present invention includes a display panel 10, a chassis 12, a circuit board 14, and a heat sink 16. The circuit board 14 is disposed on a back surface 102 of the display panel 10. The chassis 12 covers the display panel 10 and the circuit board 14. The heat sink 16 connects with the circuit board 14 and the chassis 12.

The circuit board 14 includes a power socket 142, a video graphics array (VGA) socket 144, and a plurality of studs 146 arranged thereon. The power socket 142 and the VGA socket 144 are arranged along a same edge (not labeled) of the circuit board 14. The circuit board 14, in general, is a printed circuit board (PCB).

The chassis 12 is generally rectangular, and includes a central jutting back wall 122, two opposite first side walls 124, and two opposite second side walls 126. The first side walls 124 are integrally formed with the back wall 122, and extend from two opposite lateral edges (not labeled) of the back wall 122 respectively. The second side walls 126 extend from two opposite top and bottom edges of the back wall 122 respectively. The first side walls 124 and the second side walls 126 cooperatively define a first housing (not labeled) for accommodating the display panel 10. The back wall 122 defines a second housing (not labeled) for accommodating the circuit board 14 and associated components thereof. The back wall 122 includes four heat conducting fingers 120, a plurality of fixing holes 128, a first hatch 127, and a second hatch 129. The heat conducting fingers 120 are positioned to correspond to the heat sink 16. The heat conducting fingers 120 are generally rectangular, and are arranged parallel to each other. The fixing holes 128 are positioned at a back panel (not labeled) of the back wall 122. The first hatch 127 is positioned at a bottom panel (not labeled) of the back wall 122, corresponding to the VGA socket 144 on the circuit board 14. The second hatch 129 is also positioned at the bottom panel (not labeled) of the back wall 122, corresponding to the power socket 142 on the circuit board 14.

Figure 2:
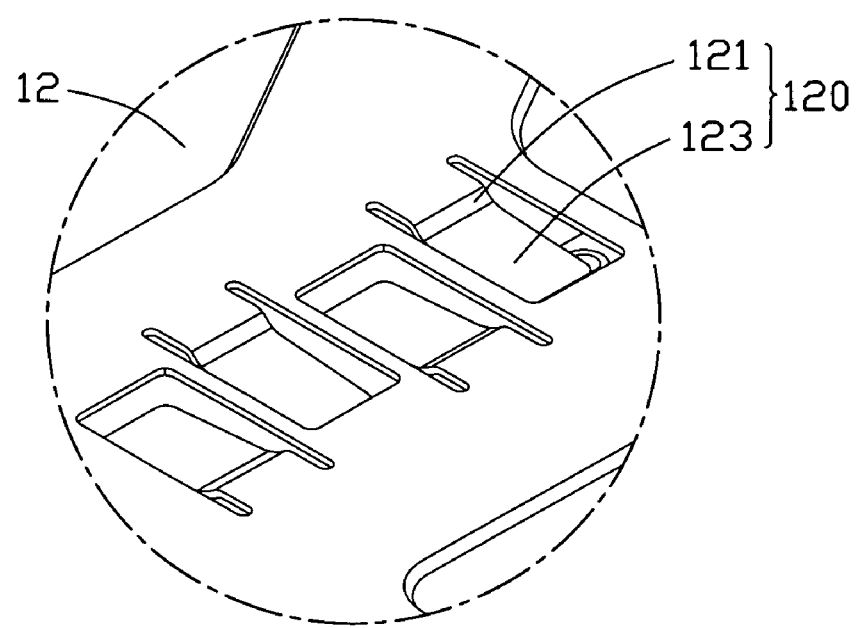
FIG. 2 is an enlarged view of a circled portion II of FIG. 1.
Figure 3:
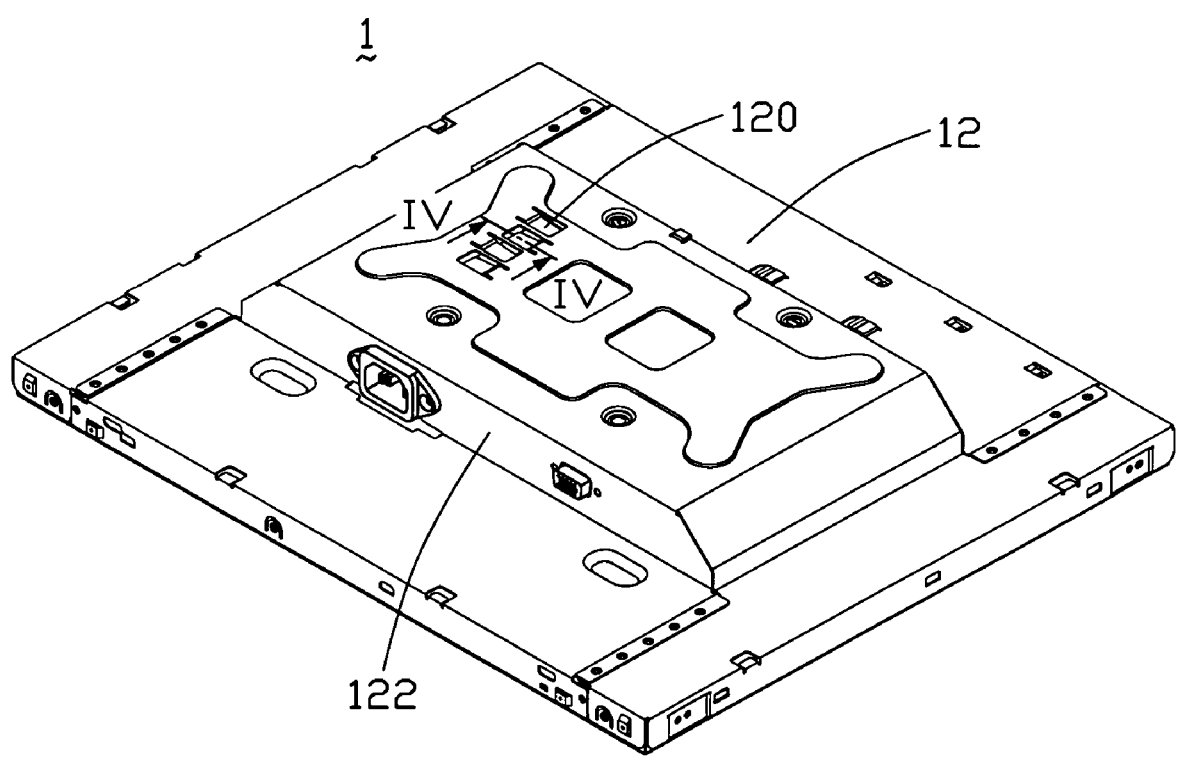
FIG. 3 is an assembled view of the display device of FIG. 1.
Figure 4:
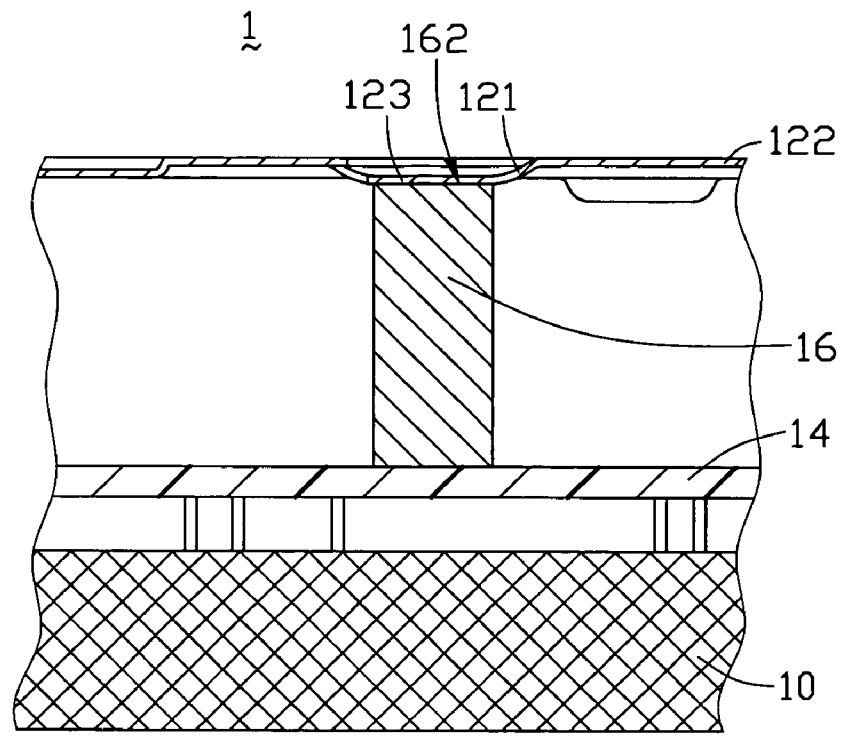
FIG. 4 is a cross-sectional view taken along line IV-IV of FIG. 3.

Referring to FIG. 2, each heat conducting finger 120 includes a base portion 121 integrally connecting with the back panel of the back wall 122, and a spring contact portion 123 integrally extending from the base portion 121. Consecutive heat conducting fingers 120 are alternately arranged, in that any one heat conducting finger 120 has its base portion 121 located nearest a first one of the first side walls 124, and an adjacent heat conducting finger 120 has its base portion 121 located nearest an opposite second one of the first side walls 124. That is, the spring contact portions 123 of any two adjacent heat conducting fingers 120 point in opposite directions. Also referring to FIG. 3 and FIG. 4, each spring contact portion 123 elastically deformably connects with a top surface 162 of the heat sink 16. Preferably, an area of contact is maximal, with a major part of the spring contact portion 123 spanning an entire corresponding width of the top surface 162 and fully contacting a corresponding portion of the top surface 162. Thus, the heat sink 16 directly connects with the circuit board 14, and directly connects with the chassis 12 through the spring contact portions 123 of the heat conducting fingers 120. A position of the heat conducting fingers 120 can be configured according to a position of the heat sink 16. The chassis 12 is typically a metal back shell of the display device 1. The chassis 12 with the heat conducting fingers 120 can be manufactured by a stamping method. The chassis 12 can be made from iron, aluminum, magnesium, or another suitable metal or alloy.

In operation, most of heat generated by the circuit board 14 and the associated components thereof can be directly conducted from the heat sink 16 to the heat conducting fingers 120 of the chassis 12. The chassis 12 has a great heat dissipating area. Therefore the above-described configuration can help to increase a heat dissipating efficiency of the display device 1. Moreover, the heat conducting fingers 120 are integrally formed with the chassis 12. This makes mass production of the display device 1 including the heat conducting fingers 120 simple and inexpensive. It also makes disassembly of the display device 1 convenient.

Figure 5:
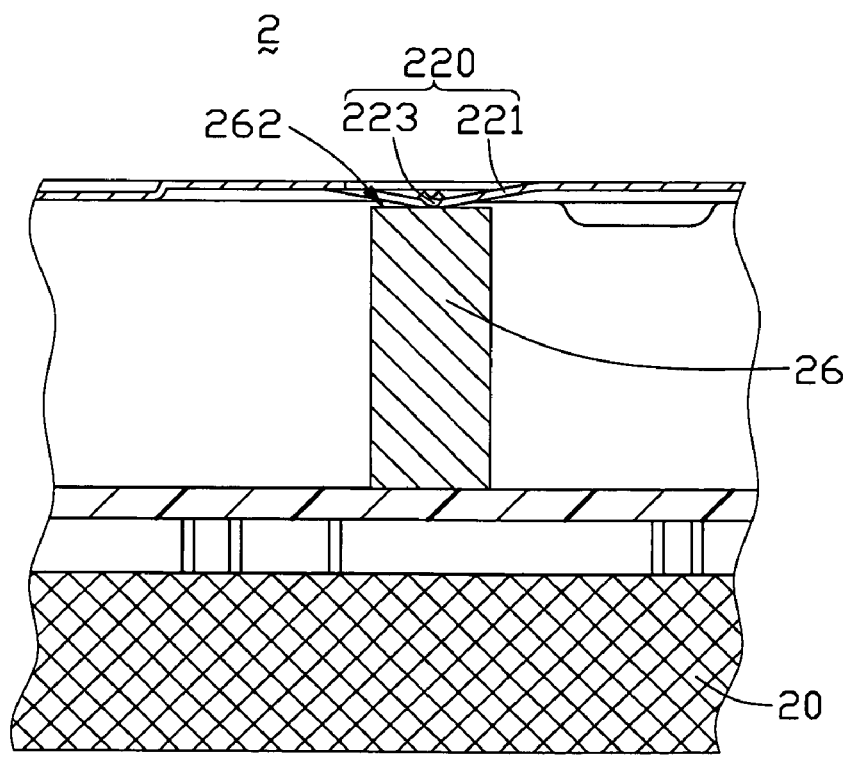
FIG. 5 is similar to FIG. 4, but showing a corresponding view in the case of a display device according to a second embodiment of the present invention.

FIG. 5 is an enlarged, cross-sectional view showing key features of a display device 2 according to a second embodiment of the present invention. The display device 2 is similar to the display device 1 of the first embodiment. However, the display device 2 includes a display panel 20 and a plurality of heat conducting fingers 220. Each heat conducting finger 220 includes a base portion 221, and a spring contact portion 223 integrally extending from the base portion 221. The spring contact portion 223 has a curved end, therefore only a substantially linear portion of the curved end can contact a top surface 262 of a heat sink 26. That is, the heat conducting finger 220 connects with the top surface 262 of the heat sink 26 with a minimal contact area, which is preferably a substantially linear contact or a substantially single point contact. With this minimal contact between the spring contact portions 223 of the heat conducting fingers 220 and the top surface 262 of the heat sink 26, the top surface 262 can avoid damage due to scraping by the heat conducting fingers 220.

Figure 6:
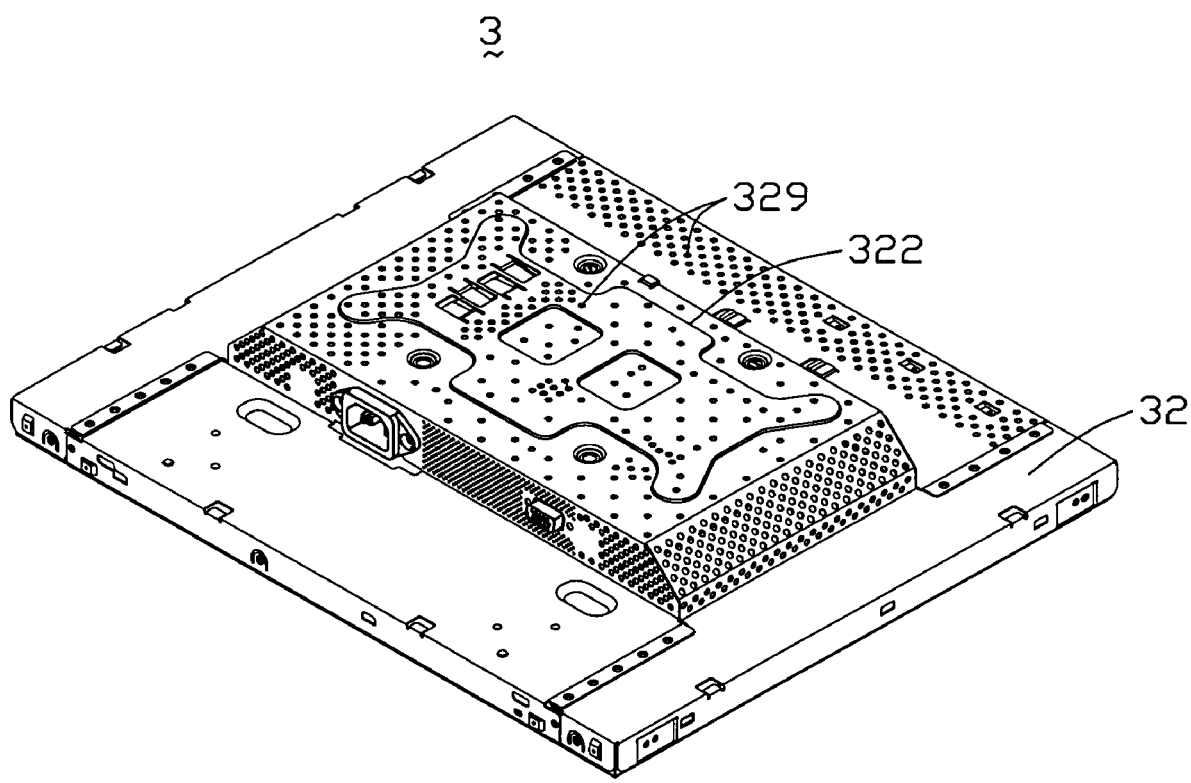
FIG. 6 is an isometric view of a display device according to a third embodiment of the present invention.
Figure 7:
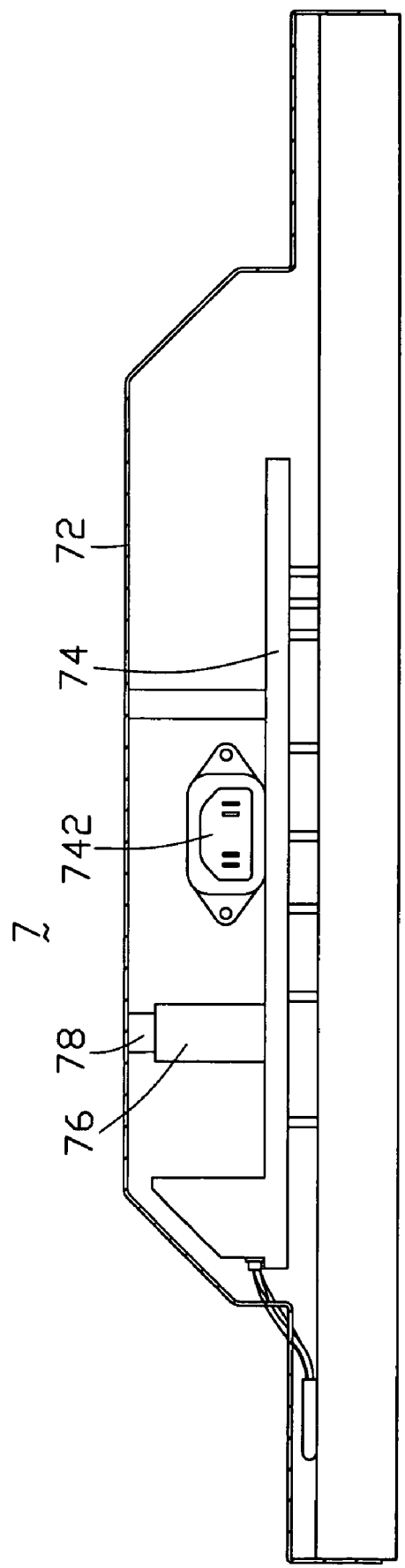
FIG. 7 is a side cross-sectional view of a conventional display device.

Referring to FIG. 6, a display device 3 according to a third embodiment of the present invention is similar to the display device 1 of the first embodiment. However, a chassis 32 of the display device 3 further includes a plurality of vent holes 329 on a back wall 322 thereof. The distribution of the vent holes 329 can be configured according to positions of sources of heat in the display device 3, such sources typically including a circuit board (not visible) and a display panel (not visible). The vent holes 329 of the chassis 32 can help to greatly increase a heat dissipating efficiency of the display device 3.

Further and/or alternative embodiments may include the following. The spring arms of the heat conducting fingers can connect with one or more side surfaces of the heat sink. Each heat conducting finger can include one or more spring arms each directly integrally connecting with the chassis without any base portion. The chassis can include only a single spring arm, which has a contact area approximately equal to that of the top surface or a side surface of the heat sink. The heat conducting fingers can connect with the heat sink with any other suitable contact areas as required.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A display device comprising:
    a circuit board;
    a chassis covering the circuit board; and
    a heat sink connecting with the circuit board and the chassis;
    wherein the chassis comprises at least one heat conducting member connecting with the heat sink, the at least one heat conducting member comprises a base portion integrally formed with a main body of the chassis, and
    a spring contact portion integrally extending from the base portion and connecting with the heat sink.

2. The display device in claim 1, wherein the spring contact portion elastically connects with the heat sink.

3. The display device in claim 2, wherein the spring contact portion connects with a top surface of the heat sink.

4. The display device in claim 2, wherein the spring contact portion connects with a side surface of the heat sink.

5. The display device in claim 1, wherein an area of contact between the spring contact portion and the heat sink is generally rectangular.

6. The display device in claim 1, wherein an area of contact between the spring contact portion and the heat sink is substantially linear or substantially a single point.

7. The display device in claim 1, wherein the at least one heat conducting member is made from metal.

8. The display device in claim 7, wherein the at least one heat conducting member is made from iron, aluminum, magnesium, or alloy.

9. The display device in claim 1, wherein the chassis further comprises a plurality of vent holes.

10. The display device in claim 9, wherein a distribution of the vent holes is configured according to positions of sources of heat in the display device.

11. A display device comprising:
    a circuit board;
    a chassis covering the circuit board; and
    a heat sink connecting with the circuit board and the chassis;
    wherein the chassis comprises a plurality of heat conducting members connecting with the heat sink, each heat conducting member comprises a base portion integrally connecting with the chassis, and
    a spring contact portion integrally extending from the base portion.

12. The display device in claim 11, wherein the spring contact portions of any two adjacent heat conducting members point in opposite directions.

13. A display device comprising:
    a circuit board;
    a chassis covering the circuit board; and
    a heat sink located between the circuit board and the chassis;
    wherein the chassis comprises unitarily a plurality of heat conducting members connecting with the beat sink, said heat conductive member is resilient with regard to the heat sink.

14. The display device in claim 13, wherein said heat conducting member is relatively close to the heat sink in comparison with portions of said chassis surrounding thereof.

15. The display device in claim 13, there is an opening at least partially surrounding said heat conducting member for air flow ventilation.

* * * * *